(12) United States Patent
Kociak et al.

(10) Patent No.: US 10,157,726 B2
(45) Date of Patent: Dec. 18, 2018

(54) CATHODOLUMINESCENCE DETECTOR INCLUDING INNER AND OUTER TUBES SEALED FROM A VACUUM CHAMBER OF AN ASSOCIATED PARTICLE BEAM SYSTEM

(75) Inventors: Mathieu Kociak, Palaiseau (FR); Luiz Fernando Zagonel, Campanas (BR); Marcel Tence, Issy les Moulineaux (FR); Stefano Mazzucco, Bethesda, MD (US)

(73) Assignees: CENTRE NATIONAL DE LA RECHERCHE SCIENTIFIQUE, Paris (FR); UNIVERSITE PARIS SUD 11, Orsay (FR)

( * ) Notice: Subject to any disclaimer, the term of this patent is extended or adjusted under 35 U.S.C. 154(b) by 743 days.

(21) Appl. No.: 13/699,975

(22) PCT Filed: Apr. 29, 2011

(86) PCT No.: PCT/FR2011/050986
§ 371 (c)(1),
(2), (4) Date: Nov. 26, 2012

(87) PCT Pub. No.: WO2011/148072
PCT Pub. Date: Dec. 1, 2011

(65) Prior Publication Data
US 2013/0087706 A1    Apr. 11, 2013

(30) Foreign Application Priority Data

May 27, 2010 (FR) ...................... 10 54109

(51) Int. Cl.
*H01J 37/244* (2006.01)
*H01J 37/02* (2006.01)
(Continued)

(52) U.S. Cl.
CPC .......... *H01J 37/244* (2013.01); *H01J 37/023* (2013.01); *H01J 37/228* (2013.01); *H01J 37/256* (2013.01);
(Continued)

(58) Field of Classification Search
CPC .......... H01J 37/00; H01J 37/02; H01J 37/147; H01J 37/16; H01J 37/222; H01J 37/224;
(Continued)

(56) References Cited

U.S. PATENT DOCUMENTS 4,900,932 A * 2/1990 Schafer et al. ............... 250/397
5,013,915 A    5/1991 Isakozawa et al.
(Continued)

FOREIGN PATENT DOCUMENTS

EP       1956632      8/2008
JP    2003157789      5/2003

*Primary Examiner* — Jason McCormack
(74) *Attorney, Agent, or Firm* — Greer, Burns & Crain, Ltd.

(57) ABSTRACT

The invention relates to a cathodoluminescence detection system comprising: a collecting optic (112) collecting light radiation (108) from a sample illuminated by a beam of charged particles and reflecting said radiation (108) onto analysis means, said collecting optic (112) being placed in a chamber, called a vacuum chamber, wherein the pressure is below atmospheric pressure; and means (316) for adapting the light radiation, placed downstream of the collecting optic (112) and designed to adapt said light radiation (108) at the inlet of the analysis means. Said system is characterized in that all or part of the adapting means (316) is placed in an environment where the pressure is higher than the pressure in said vacuum chamber.

15 Claims, 7 Drawing Sheets

(51) Int. Cl.
*H01J 37/22* (2006.01)
*H01J 37/256* (2006.01)
*H01J 37/26* (2006.01)

(52) U.S. Cl.
CPC ......... *H01J 37/26* (2013.01); *H01J 2237/024* (2013.01); *H01J 2237/2482* (2013.01)

(58) Field of Classification Search
CPC ........ H01J 37/226; H01J 37/244; H01J 37/26; H01J 37/261; H01J 37/285; H01J 37/301
USPC ........................ 250/305, 306, 307, 310, 311
See application file for complete search history.

(56) References Cited

U.S. PATENT DOCUMENTS

| | | | | |
|---|---|---|---|---|
| 5,256,877 | A | * | 10/1993 | Czernuszka et al. ............. 850/9 |
| 5,517,033 | A | * | 5/1996 | Krivanek ............. H01J 37/224 250/397 |
| 5,536,941 | A | * | 7/1996 | Swann ................. H01J 37/224 250/311 |
| 5,717,207 | A | * | 2/1998 | Koguchi et al. .............. 250/311 |
| 6,061,085 | A | * | 5/2000 | Daberkow et al. ............. 348/80 |
| 6,670,615 | B2 | * | 12/2003 | Gilmore et al. ............. 250/397 |
| 7,202,953 | B1 | * | 4/2007 | Mueller et al. ............. 356/445 |
| 7,589,322 | B2 | * | 9/2009 | Nishikata et al. ............ 250/310 |
| 7,964,846 | B2 | * | 6/2011 | Mooney et al. ............. 250/311 |
| 2003/0053048 | A1 | * | 3/2003 | Bennett et al. ............. 356/301 |
| 2004/0120042 | A1 | * | 6/2004 | Nagase et al. ............... 359/494 |
| 2006/0077282 | A1 | * | 4/2006 | Kido et al. .................... 348/362 |
| 2007/0023655 | A1 | * | 2/2007 | Nishikata et al. ............ 250/310 |
| 2007/0259441 | A1 | * | 11/2007 | Saaski ............................ 436/164 |
| 2008/0315093 | A1 | | 12/2008 | Hasegawa |

* cited by examiner

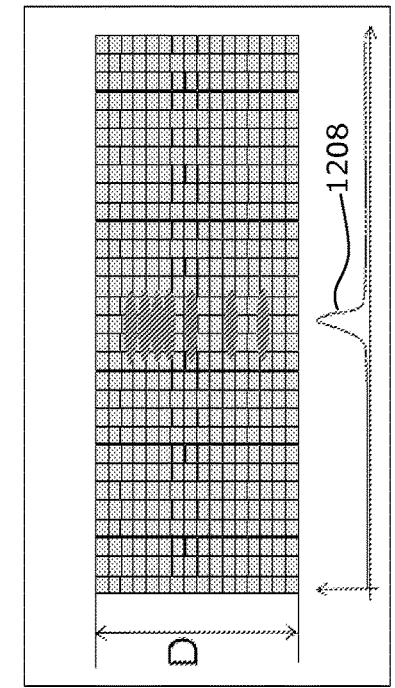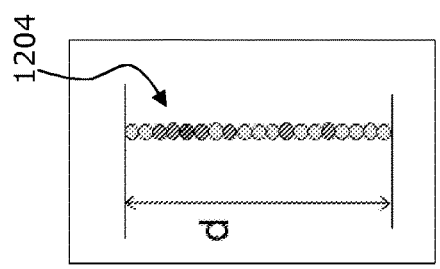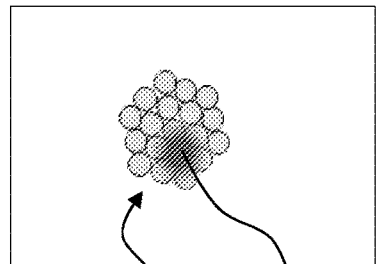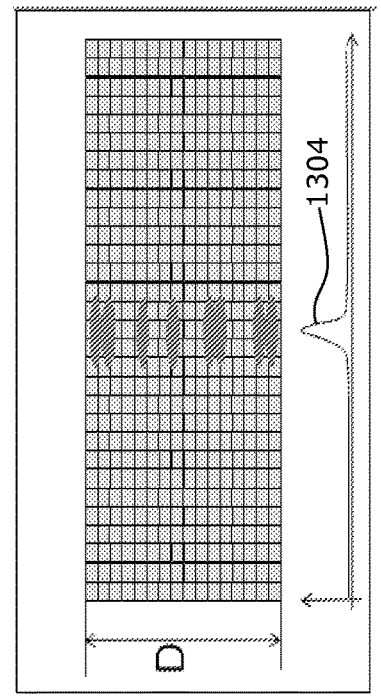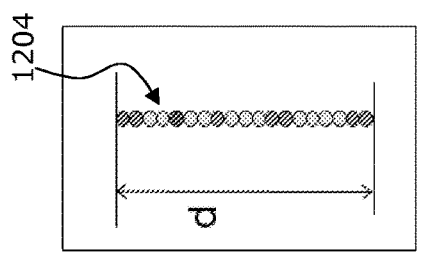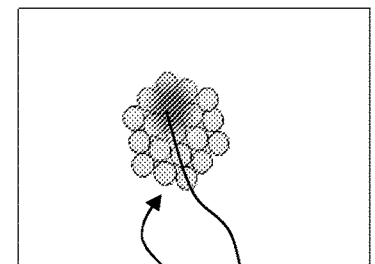
FIG.12
FIG.13

CATHODOLUMINESCENCE DETECTOR INCLUDING INNER AND OUTER TUBES SEALED FROM A VACUUM CHAMBER OF AN ASSOCIATED PARTICLE BEAM SYSTEM

The present invention relates to a cathodoluminescence detection system. It also relates to a microscope implementing such a system.

The field of the invention is the field of cathodoluminescence, and more particularly the field of systems using charged particles such as charged particle microscopes, for example microscopes using the principle of cathodoluminescence.

Numerous cathodoluminescence detection systems coupled with charged particle microscopes are currently known, such as transmission electron microscopes (TEM) or scanning transmission electron microscopes (STEM).

The physical effect used in these microscopes, known as cathodoluminescence, is based on the detection of optical signals emitted due to excitation by a beam of charged particles. The microscopes used are equipped with a charged particle cannon producing a charged particle beam that is aimed at a sample under examination. The sample struck by the particle beam is excited and in turn emits light radiation. The light radiation is collected by a collection optic the role of which is to direct the light radiation towards means of analysing said light radiation. So-called adjustment means can be arranged between the collection optic and the analysis means to adjust and convey the light radiation to the input of the analysis means. Such a microscope is described in U.S. Pat. No. 7,589,322.

However, the known cathodoluminescence detection systems are not flexible. The collection optic and the adjustment means are located in a chamber inside which the pressure is reduced, a vacuum chamber. It is not possible to perform a maintenance operation on these components without opening the microscope column. For example, when a maintenance operation is necessary on the adjustment means, it takes a long time to vent the microscope and to re-establish the vacuum, and the adjustment means are difficult to access. Furthermore, these microscopes are very sensitive machines that require very accurate adjustment, which further complicates maintenance operations.

Moreover, it is not possible either to change a component on these cathodoluminescence systems to adjust their use to a specific application. Any modification requires, once again, intervention by the manufacturer or a technician.

An aim of the present invention is to remedy the aforementioned drawbacks.

Another aim of the present invention is to propose a cathodoluminescence detection system that is easier and less costly to maintain.

Furthermore, another aim of the invention is to propose a more flexible cathodoluminescence detection system that can be modified easily depending on the application.

According to an aspect of the invention, at least one of these aims is achieved by a cathodoluminescence detection system comprising:
  a collection optic collecting light radiation coming from a sample illuminated by a charged particle beam and sending said radiation to analysis means, said collection optic being arranged in a chamber, called vacuum chamber, in which the pressure is below atmospheric pressure, and
  means of adjusting the light radiation arranged downstream of the collection optic and capable of adjusting said light radiation to the input of the analysis means;

said system being characterised in that all or part of the adjustment means are arranged in an environment in which the pressure is greater than the pressure in said vacuum chamber.

In this application, the terms "upstream" and "downstream" are defined relative to and in the direction of the light radiation path, i.e., in the direction from the charged particle emission source towards the sample, then towards the collection optic and finally towards the light radiation analysis means.

The collection optic is defined as being all of the components performing the collection of the light radiation emanating from the sample and sending such light radiation to the analysis means.

Thus, the cathodoluminescence detection system is more flexible and can be modified more easily depending on the application. As the adjustment means are not located in the vacuum chamber, they can be exchanged or replaced more easily depending on the application. It is moreover possible to add components allowing for the processing of the light radiation, such as for example a polariser, before the light radiation enters the analysis means.

Furthermore, the cathodoluminescence detection system is easier and less costly to maintain than the systems of the state of the art. As the adjustment means are more easily accessible, they can be changed more easily in the event of a malfunction.

The system according to the invention advantageously comprises sealing means arranged between the collection optic and the adjustment means that are capable of ensuring the leaktightness of said chamber while permitting the light radiation to pass through. Such sealing means can for example comprise a window made from a transparent material having no influence on the light radiation and able to withstand the difference in pressure between the vacuum chamber and the environment in which the adjustment means are located, for example the atmospheric environment.

The adjustment means can comprise at least one lens arranged upstream of an optical fibre and capable of adjusting the size of the light radiation to the input of the optical fibre, and more particularly the size of the light beam to the diameter of the optical fibre and the angle of incidence to the numerical aperture of the optical fibre. The role of the optical fibre is to convey the light radiation to the analysis means.

In a particular embodiment, the collection optic can comprise a parabolic mirror sending the light radiation, for example in a collimated manner. In this case, the parabolic mirror can comprise a through-hole arranged opposite the charged particle emission source and letting the charged particle beam through to the sample.

In a second particular embodiment, the collection optic can comprise a plane mirror. This plane mirror can be combined with a collecting lens arranged downstream of said plane mirror and sending the light radiation, for example in a collimated manner. In this case, the plane mirror can comprise a through-hole arranged opposite the charged particle emission source and letting the charged particle beam through to the sample.

In a third particular embodiment, the collection optic can comprise an elliptical mirror, optionally combined with a collecting lens arranged downstream of the elliptical mirror.

More generally, the collection optic can comprise a concave mirror.

In an advantageous version, the system according to the invention can comprise a tube in the form of a cylinder, called outer cylinder, the axis of which is aligned relative to the axis of the collection optic and rigidly secured to said collection optic, said outer cylinder comprising a window seal ensuring that the pressure is maintained in the chamber in which said collection optic is arranged. The window seal is made from a material that:

permits the light radiation coming from the collection optic to pass through, and ensures the leaktightness of the vacuum chamber.

Thus, the pressure inside the outer cylinder and downstream of the window seal is greater than the pressure in the vacuum chamber, for example atmospheric pressure. This part of the outer cylinder is more easily accessible by an operator than the inside of the vacuum chamber.

Still in this advantageous version, the system according to the invention can optionally also comprise a tube in the form of a cylinder, called inner cylinder, arranged centred in the outer cylinder and capable of receiving the means of adjusting the light radiation with a view to injecting said light radiation into an optical fibre or into a means of analysis such as a photomultiplier, a camera or a spectrometer equipped with a camera or a photomultiplier.

The optical adjustment means can comprise a set of lenses and/or mirrors allowing for the size of the optical radiation to be adjusted to the space constraints imposed by the walls of the tube in order to conserve the intensity up to the final detector. The various components of the adjustment optic will have numerical apertures adjusted relative to each other and relative to the detection or optical fibre systems, again to preserve the intensity along the optical radiation path. If an optical fibre is used before the detector, its numerical aperture will be adjusted to said detection system.

The inner cylinder can also comprise any optical component used for the needs of the experiment, for example a polariser or a filter.

Advantageously, the inner cylinder can be mounted removably in the outer cylinder. It is thus possible to extract it from the outer cylinder to operate on the components located inside.

The inner cylinder can also be mounted rotating freely relative to said outer cylinder. It is thus possible to modify the orientation of the components located inside the inner cylinder easily and quickly without having to remove the inner cylinder or the optical component located inside the inner cylinder. Such a configuration is particularly advantageous if the inner cylinder comprises at least one optical component the orientation of which is important in the processing of the light radiation, for example a polariser.

In addition, the inner tube is automatically centred on the outer tube and therefore on the optical axis. This allows for the tube to be changed without it becoming misaligned, making the changing of inner tubes fast, robust and reproducible.

The system according to the invention can also comprise light radiation analysis means arranged downstream of the adjustment means.

Advantageously, the components located in the inner cylinder are placed as close as possible to the collection optic to reduce the effects of any slight misalignment between the optical axis of the collection optic and the centre of the inner cylinder.

Furthermore, said outer cylinder has a sufficiently large inner diameter to allow for the use of optical components, such as lenses, or detectors such as photomultipliers and CCD cameras, inside the outer cylinder.

Advantageously, the collection optic can have a conductive surface electrically isolated from the rest of the device and the microscope. The collection optic can thus be placed at a low electric potential relative to the mass of the microscope, optionally via a wire accessible from the outside of the microscope via a sealed electrical passage, in order to thus detect any contact with the microscope through the appearance of an electric current. The collection optic is located in a crowded space and should not be knocked against the standard components of the microscope, such as the sample or the pole piece. These movements must be carefully monitored. By measuring the electric current between the collection optic and the microscope, it is possible to determine the occurrence of slight contact between the collection optic and the microscope.

The analysis means can comprise, in a non-exhaustive manner, a CCD camera and/or a photomultiplier, preceded or not by a spectrometer.

In a particular embodiment, the optical fibre is directly connected to the analysis means.

In a particular embodiment, the optical fibre can be replaced by a set of adjacent fibres directly connected to the analysis means.

In a particular embodiment, the adjacent fibres are arranged in a disc upstream, and in a line downstream. The disc arrangement allows for the signal to be collected even in the event of a slight offset, and the line arrangement allows for optimisation of the intensity and spectral resolution when the set of fibres is placed at the input of an optical spectrometer, for example.

Advantageously, the adjustment means can comprise a diaphragm arranged to let the light radiation coming from the collection optic through to the analysis means and block at least one undesirable optical signal. In a particular embodiment, a diaphragm can be placed centred along the optical axis, allowing for the light radiation emitted around the focal point of the collection optic (on the sample) to be let through and allowing for the light radiation emitted from other areas of the sample to be filtered.

When the charged particle beam strikes the sample, it can eject different particles such as so-called secondary electrons and ions and so-called back-scattered charged particles. These secondary and back-scattered particles can in turn strike different objects inside the microscope (and far from the focal point of the collection optic) and cause the emission of irrelevant light radiation, which will therefore be filtered with a diaphragm.

Advantageously, the adjacent fibres, arranged in a disc upstream, have a small diameter designed to act as a diaphragm.

Advantageously, the collection optic can be mounted movably in at least one dimension, the system according to the invention also comprising positioning means capable of moving said collection optic in at least one dimension. Thus, the system according to the invention is even more flexible and is positionable, thus allowing for the improvement of the radiance and spatial resolution of the signal obtained.

Advantageously, the collection optic positioning means can comprise means of translating said collection optic in at least one dimension.

The collection optic positioning means can also comprise means of rotating said collection optic about at least one rotation axis.

The positioning means can comprise a stage mounted movably in at least one dimension, the collection optic being securely mounted on said stage, said system also comprising at least one positioning component, for example a micrometer screw or a piezoelectric or capacitive actuator, each positioning component being capable of moving said stage in at least one dimension.

In a particular embodiment of the cathodoluminescence detection system according to the invention, the collection optic is securely mounted at the proximal end of the outer cylinder, fully centred on and coaxial with the optical axis of the collection optic. The outer cylinder comprises, on the side of its proximal end, a transparent window seal arranged to preserve the leaktightness of the vacuum chamber. The inner cylinder is removably inserted into the outer cylinder and can rotate freely. The inner cylinder is mounted coaxially with the outer cylinder and is therefore necessarily centred relative to the optical axis of the collection optic at all times. The adjustment means, together with the input of the optical fibre, are arranged in the inner cylinder and are therefore at atmospheric pressure. These components can easily be accessed by an operator as the inner cylinder is removable. The inner cylinder can also comprise any optical component, such as for example a polariser.

The outer cylinder is surrounded by at least one sealing means permitting the movement of the outer cylinder in the three directions of space while preserving the leaktightness of the vacuum chamber in which the collection optic is located. Such sealing means can for example comprise a bellows seal permitting the movement of the cylinder in all three directions and mounted on a wall of the vacuum chamber around or level with an opening made in such wall in the direction followed by the light radiation sent by the collection optic to the analysis means.

The outer cylinder is securely mounted on a stage. Such stage can be moved in the three directions of space by means of micrometer screws. Thus, by moving the stage, the operator can move the outer cylinder and the collection optic.

When the stage, outer cylinder and collection optic assembly is moved, the leaktightness of the vacuum chamber is conserved by means of the bellows seal surrounding the outer cylinder and secured to the wall of the vacuum chamber, and by means of the window seal arranged in the outer cylinder.

The collection optic is integral with the outer cylinder. The latter is centred relative to the optical axis of the collection optic. The inner cylinder is centred relative to the outer cylinder. All of the components located inside the inner cylinder are thus centred relative to the optical axis of the collection optic. As the collection optic+outer cylinder+ inner cylinder are securely attached to each other, they remain fully centred at all times.

Advantageously, the system according to the invention can comprise an emission source of a light beam propagating in the opposite direction to the direction of propagation of the detected light radiation coming from the sample and received by the collection optic, said light beam being directed towards the sample by the collection optic.

The cathodoluminescence system can also be used to inject light onto the sample. In this case, the cathodoluminescence system comprises a light beam emission source instead of or as well as the detection system. This source is then arranged to emit a light beam in the opposite direction to the direction of propagation of the detected light radiation, i.e. from downstream to upstream. The light source is focused on the sample, the areas of exposure to the charged particles and the light beam being superimposed. The light source can be a spatially coherent light source, for example a laser, so that the size of the light beam striking the sample is only limited by the laws of geometric optics and diffraction in order to optimise the power density received by the sample.

Advantageously, the system according to the invention can also be used with a light radiation separator and can be used to inject light onto the sample and at the same time collect the light emitted by the sample.

The cathodoluminescence system can also be used to detect the light radiation emitted by the sample by the effect of photoluminescence, i.e. when a light beam strikes an object, which in turn incites it to emit light radiation. This separator is then arranged to allow for the injection of a light beam from downstream to upstream and the simultaneous detection of light radiation from upstream to downstream. The small size of the injected beam can allow for the excitation of a small part of the sample, which can at the same time be imaged with the charged particle beam of the microscope. The light radiation emitted by the sample during the injection of light can be analysed in the same way as the light radiation emitted following the interaction of charged particles.

According to another aspect of the invention, a cathodoluminescence system is proposed that allows for the collection of the light radiation coming from the sample illuminated by a beam of nanometric or sub-nanometric charged particles with which the surface of the sample is optionally scanned, and its conveyance to analysis means while conserving more light intensity and spectral resolution compared with the cathodoluminescence systems of the state of the art.

According to the invention, such a cathodoluminescence system comprises:
- a source of charged particles arranged to illuminate a sample with a charged particle beam, and
- an optical path comprising at least two optical components capable of collecting and conveying light radiation coming from said illuminated sample to analysis means;

said system being characterised in that each optical component of said optical path is selected so that:
- the maximum output angle of said optical component is less than or equal to 120% of the maximum acceptance angle of the next optical component; and
- the diameter of the radiation coming from said optical component in the input plane of the next optical component is less than or equal to 120% of the useful input diameter of the next optical component.

Thus, according to the invention each component transmits at least 60% of the optical signal. Just 20% of the optical signal is lost at each optical component on the optical path.

Such a cathodoluminescence system allows for the collection of the light radiation coming from the illuminated sample and its conveyance to the analysis means while conserving more light intensity compared with the cathodoluminescence systems of the state of the art.

According to a preferred embodiment of the system of the invention, each optical component on the optical path is selected so that the maximum output angle of an optical component is less than or equal to the maximum acceptance angle of the next optical component. Thus, the output angle of an optical component is adjusted and the light radiation leaving an optical component reaches the next optical component at such an angle that all of the light radiation enters the next optical component.

Still according to a preferred version of the system according to the invention, each optical component of the optical path is selected so that the diameter of the radiation coming from an optical component in the input plane of the next optical component is less than or equal to the useful input diameter of the next optical component. Thus, all of the light radiation reaching the next optical component enters the next optical component.

In a combination of these two preferred versions of the system according to the invention, this version being the preferred version of the invention, the optical signal is transmitted from one optical component to another without any loss of intensity other than that due to the absorption or diffusion of the optical systems and all of this intensity of the optical signal is conserved along the entire optical path.

Advantageously, when the optical path comprises N optical components, each optical component of the optical path can be positioned so that the offset of one optical component relative to the centre of the previous optical component complies with the following relationship:

$$Ds_i/2 \leq 1.2\, De_{i+1}/2 - \Delta_{i+1} \text{ for } i=1 \ldots N-1$$

where:
$\Delta_{i+1}$ is the offset of optical component i+1 relative to the centre of optical component i,
$De_{i+1}$ is the useful input diameter of component i+1,
$Ds_i$ is the diameter of the radiation coming from component i measured at the input of component i+1.

Such a system allows for improved positioning relative to the systems of the state of the art and thus for conveyance of the light radiation along the entire optical path with little loss.

In a preferred version of the system according to the invention, each optical component of the optical path can be positioned so that the offset of one optical component relative to the centre of the previous optical component verifies the following equation:

$$Ds_i/2 \leq De_{i+1}/2 - \Delta_{i+1} \text{ for } i=1 \ldots N-1$$

where:
$\Delta_{i+1}$ is the offset of optical component i+1 relative to the centre of optical component i,
$De_{i+1}$ is the useful input diameter,
$Ds_i$ is the diameter of the beam coming from component i measured at the input of component i+1.

Such a system allows for positioning of the optical components such that all of the radiation leaving an optical component enters the next optical component without any loss other than that caused by absorption or diffusion as none of the optical components is offset relative to the previous optical component to such an extent that some of the radiation is lost.

According to the invention, one of the optical components on the optical path can be a spectrometer, and more particularly a spectrometer comprising a focusing component at its input.

In this case, the spectrometer and the other optical components of the optical path can be selected so that the width of the beam at the input of the spectrometer in the dispersive direction is less than or equal to 10 times the limit diameter at the input of the spectrometer below which the resolution of the spectrometer no longer depends on the diameter of the waist of the light radiation at the input of the spectrometer. The value of such a limit diameter is provided by the spectrometer manufacturer and depends largely on its magnification in the dispersive direction.

Thus, the system according to the invention allows for the light radiation to be conveyed to the spectrometer without any loss of intensity, as the diameters and angles are adjusted, while ensuring the optimum spectral resolution for a given spectrometer.

Still in a situation in which one of the components of the optical path is a spectrometer, the spectrometer and the other optical components of the optical path can preferably be selected so that the width of the beam at the input of the spectrometer in the dispersive direction is less than or equal to the limit diameter at the input of the spectrometer below which the resolution of the spectrometer no longer depends on the diameter of the waist of the light radiation at the input of the spectrometer.

Thus, the system according to the invention allows for the light radiation to be conveyed to the spectrometer without any loss of intensity, as the diameters and angles are adjusted, while ensuring optimum spectral resolution for a given spectrometer.

In a particular embodiment, the optical component before the spectrometer can comprise an optical fibre the output of which is positioned or imaged at the input of the spectrometer.

In this case, the optical fibre and the optical component before the optical fibre can be selected so that:
the diameter of the beam coming from the previous optical component measured at the input of the fibre is less than or equal to 120%, preferably less than or equal to 100%, of the useful diameter of the optical fibre, and
the maximum input angle of the beam coming from the previous optical component is less than or equal to 120%, preferably less than or equal to 100%, of the limit angle of incidence of said optical fibre.

Thus, the optical path is perfectly adjusted so that all of the light radiation enters the optical fibre under conditions such that all of the optical radiation is conveyed to the spectrometer without loss or with negligible loss.

In a particularly advantageous and preferred embodiment of the invention, the optical component before the spectrometer can comprise a plurality of optical fibres constituting an optical fibre bundle, the fibres of said bundle being aligned, on the side of said spectrometer, perpendicular to the dispersion axis in the input plane of said spectrometer, the sum of the diameters of all of the fibres is preferably less than or equal to the size of the detector in the non-dispersive direction divided by the magnification of the spectrometer in the non-dispersive direction. Each optical fibre constituting the optical fibre bundle is selected so that:
the diameter of the beam coming from the previous optical component at the input of the fibre is less than or equal to 120%, preferably 100%, of the useful diameter of the optical fibre, and
the maximum input angle of the beam coming from the previous optical component is less than or equal to 120%, preferably 100%, of the limit angle of incidence of said optical fibre.

Thus, this construction ensures that whatever the offset of the last optical component on any axis of space, at least one optical fibre is positioned to receive all of the radiation, or almost all of the radiation. Furthermore, as the fibre bundle is oriented perpendicular to the non-dispersive direction of the spectrometer, the spectral resolution will depend on the width of the fibres and not on the diameter of the beam, although the intensity collected depends on the sum of the areas of the illuminated fibres. Such a system is particularly effective for correcting the so-called dynamic errors due to misalignments cased for example by a scanning of the sample with the charged particle beam or systematic alignment errors.

In a particular embodiment, the fibre bundle can be compact and preferably have a hexagonal input.

The diameter of each of the fibres in the fibre bundle can be identical.

Moreover, in a preferred but non-limitative version, the ratio between the total diameter of the fibre bundle and the diameter of a fibre can be between 3 and 30.

Advantageously, the first optical component can comprise a collection component that can be either a curved mirror or a plane mirror combined with a lens to collect the light radiation coming from the sample. To be inserted into the pole piece of the microscope into which the cathodoluminescence system is inserted and which enables the formation of the charged particle beam, and given that the space inside such pole pieces is smaller the better the desired spatial resolution, this collection component advantageously has a total thickness of between 0.5 and 10 mm, and preferably between 1 and 8 mm, to allow for the collection of the light radiation coming from the sample at the largest possible solid angle.

To improve the collection of the light radiation coming from the sample, the first optical component performing the collection of the light radiation can advantageously have:
- a parameter "p" of between 0.5 and 20 mm, more preferably between 1 and 7 mm, and even more preferably between 1.5 and 5 mm, still more preferably between 1 and 3 mm, or a parameter "p" of the order of 2 mm±1.5 mm; or
- a focal length "f" of between 0.25 and 10 mm, more preferably between 0.5 and 3.5 mm, and still more preferably between 0.75 and 2.5 mm.

According to an advantageous embodiment, the optical components of the optical path can be positioned so that the accuracy of the movement in at least one of the two directions of space perpendicular to the optical axis is better than or equal to:
- the size at the spectrometer input, i.e. the dimension of the pixel of the detector divided by the magnification of the spectrometer, divided by the total magnification produced on the optical path between the source and the spectrometer input, or
- when the optical component before the spectrometer is a fibre or an optical fibre bundle, the diameter of the optical fibre, or of the largest fibre in the bundle, divided by the total magnification produced on the optical path up to the input of the optical fibre or optical fibre bundle.

In such a system, the alignment accuracy in the plane perpendicular to the optical axis is such that the residual misalignments do not essentially reduce the performance described (conservation of intensity collected up to the detector, optimum spectral resolution).

Advantageously, the optical components of the optical path can also be positioned so that the accuracy in the direction of the optical axis is greater than or equal to:
- the size of the spectrometer input, i.e. the dimension of the pixel of the detector divided by the magnification of the spectrometer, divided by the magnification produced on the optical path between the source and the spectrometer input plane and by the maximum acceptance angle of the first optical component, or
- when the last optical component is a fibre or an optical fibre bundle, the diameter of the optical fibre, or the diameter of the largest fibre in the bundle, divided by the magnification produced on the optical path between the source and the input plane of the optical fibre or fibre bundle and by the maximum acceptance angle of the first optical component.

In such a system, the alignment accuracy along the optical axis is such that the residual misalignments do not essentially reduce the performance described: conservation of the intensity collected up to the detector, optimum spectral resolution, etc.

In the system according to the invention, the optical path comprises at least two optical components, at least one first optical component, called collection optic, to collect light radiation coming from the illuminated sample and at least one second optical component, called adjustment optic, to convey the radiation collected to analysis means.

This system can also comprise translation means, to translate the collection optic linearly and independently on three different axes in space. Thus, the movement of the collection optic takes place along each axis independently of the other axes. Moreover, the movement on each axis is a translation.

In a particular version of the system according to the invention, all or part of the adjustment optic can be arranged in an environment in which the pressure is greater than the pressure in a vacuum chamber in which the collection optic is arranged.

Of course the two aspects of the present invention set out above are independent of each other, but can be combined in a single cathodoluminescence system. The invention also relates to such a cathodoluminescence system combining the two aspects described in the present application.

The invention also proposes a microscope comprising:
- a source of emission of a charged particle beam, and
- a cathodoluminescence detection system according to the invention.

Advantageously, the microscope according to the invention can also comprise at least:
- one bright field detector,
- one dark field detector,
- one EELS detector,
- one camera for imaging or diffraction, or
- one EDX detector.

Other advantages and characteristics of the invention will become apparent on examination of the detailed description of an embodiment which is in no way limitative, and the attached diagrams, in which.

Figure 10:
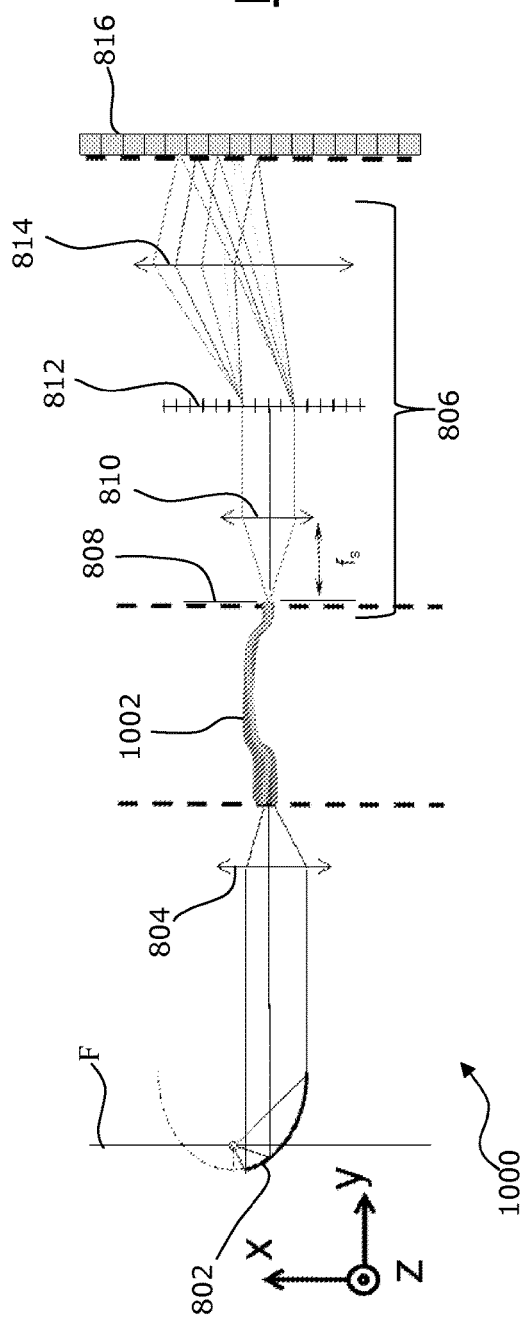
Figure 11:
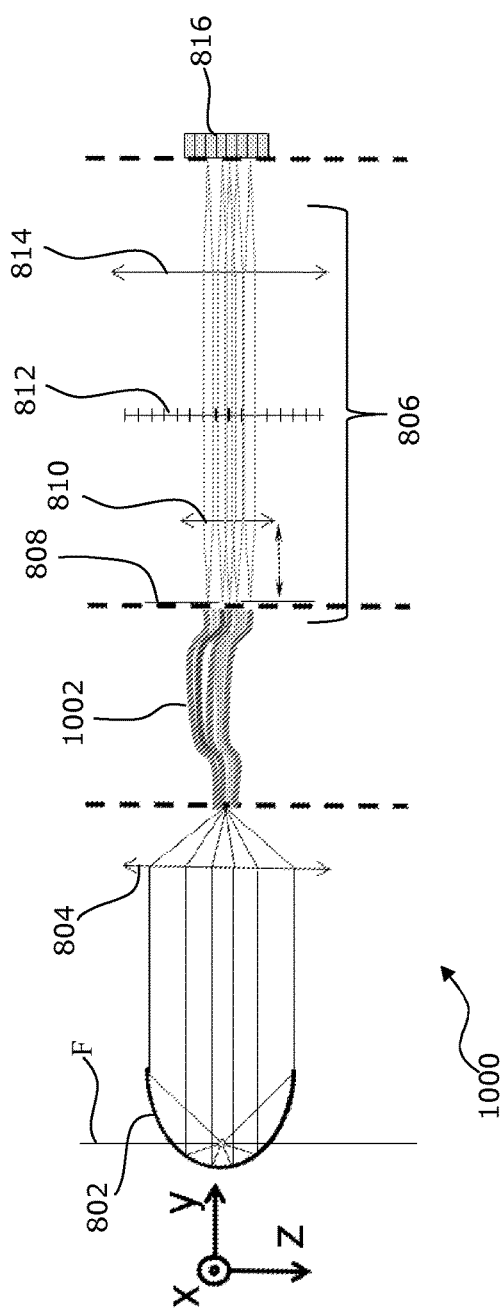

FIGS. 10 and 11 are diagrammatic representations of different views of a third example of the optical path of a cathodoluminescence system according to the third aspect of the invention comprising an optical fibre bundle; and FIGS. 12 and 13 are diagrammatic representations of two configurations in which the light radiation reaches the input of the optical fibre bundle in two different positions in the system of FIGS. 10 and 11.

Figure 1:
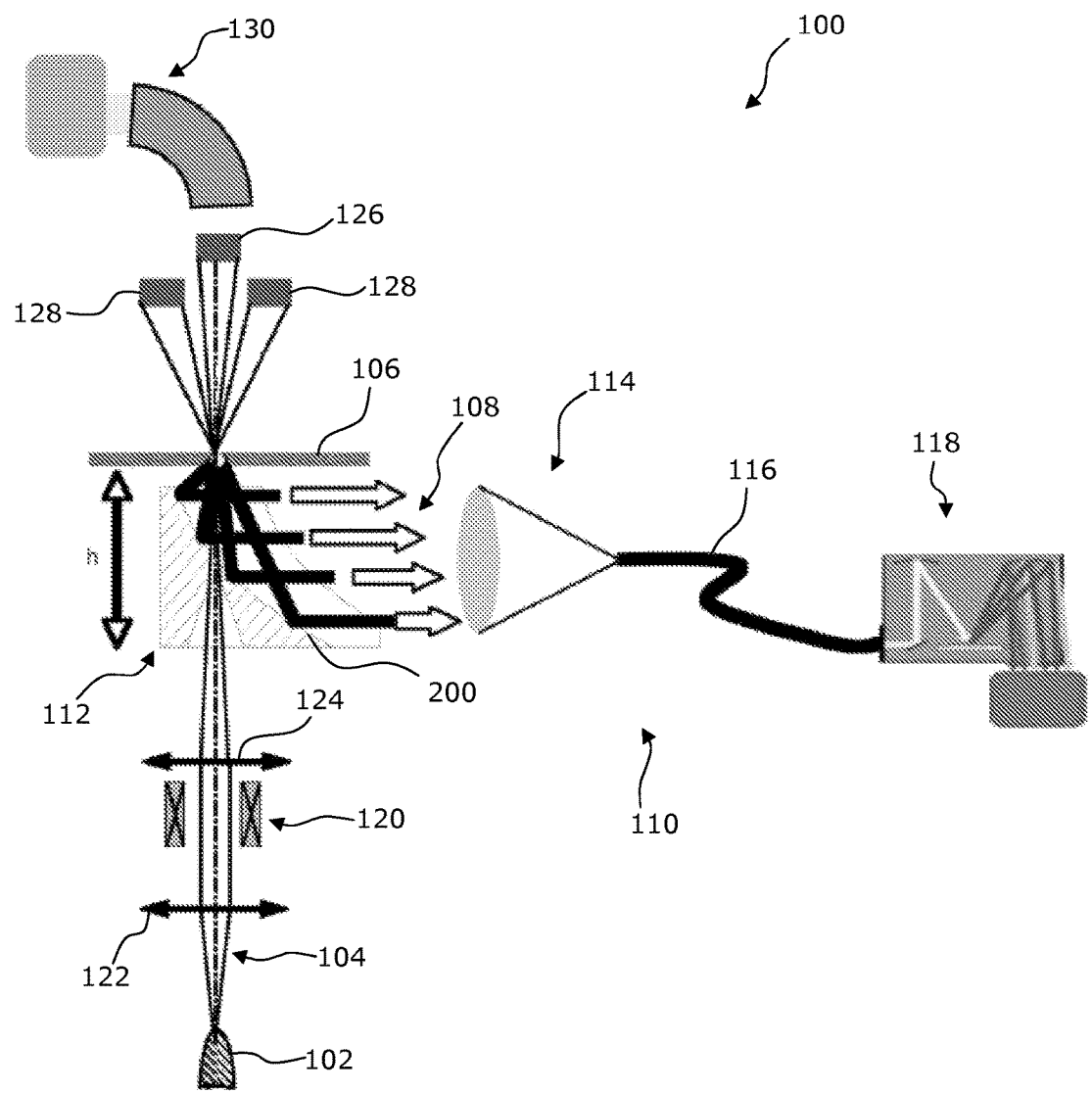
FIG. 1 is a diagrammatic representation of the principle of a microscope according to the invention implementing a cathodoluminescence detection system according to the invention.

FIG. 1 is a diagrammatic representation of the principle of the cathodoluminescence detection system implemented by a microscope 100.

The microscope 100 comprises a source 102 of emission of an electron beam 104 onto a sample 106. In response to this electron beam 104, the sample 106 emits light radiation 108 that can comprise wavelengths ranging from infrared to ultraviolet.

The light radiation 108 is then collected and analysed by a cathodoluminescence detection system 110.

The cathodoluminescence detection system 110 comprises a collection optic 112, means 114 of adjusting the diameter (respectively the angle) of the light beam 108 to the diameter (respectively numerical aperture) of an optical fibre 116 and analysis means 118. The role of the collection optic 112 is to collect the light radiation 108 emitted by the sample 106, the role of the optical fibre 116 is to convey the light radiation 108 collected by the collection optic 112 to the analysis means 118. However, it is necessary to use adjustment means 114 to adjust the light radiation 108 at the output of the collection optic 112 to the input of the optical fibre 116 while preserving the intensity and spectral resolution of the signal.

The analysis means 118 can comprise a spectrometer, a CCD camera or a photomultiplier capable of analysing the light radiation 108 conveyed by the optical fibre 116.

The microscope 100 also comprises a deflection/scanning coil 120 arranged between a condenser lens 122 positioned on the side of the electron source 102 and an objective lens 124 positioned on the opposite side. The deflection coil 120 allows for the surface of the sample 106 to be scanned with the electron beam 104 to perform a spectroscopic examination of the sample 106.

The microscope can also comprise one or more bright field detectors 126, one or more dark field detectors 128 and an EELS detector 130.

Figure 2:
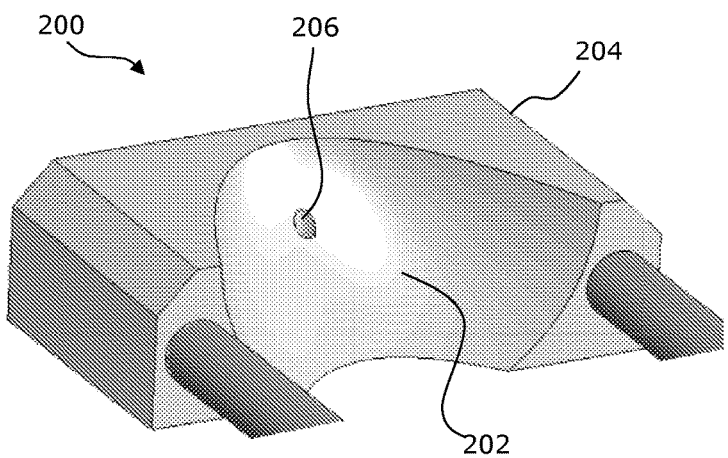
FIG. 2 is a diagrammatic representation of an example of a collection optic implemented in the cathodoluminescence system according to the invention.

In the example shown in FIG. 1, the collection optic 112 comprises a parabolic mirror 200 as shown in FIG. 2. The parabolic mirror has a reflective parabolic surface 202 cut into a block 204. The parabolic mirror 200 comprises a through-hole 206. This hole 206 is arranged opposite the electron beam 104 emission source 102. The electron beam 104 passes through this hole 206 to reach the sample 106. The light radiation emitted by the sample is then collected by the parabolic surface 202. The precise positioning of the hole 206 opposite the emission source is very important to optimise the radiance/brilliance and resolution of the light radiation collected by the parabolic surface 204.

In another embodiment (not shown), the collection optic 112 can comprise a plane mirror combined with a collecting lens or an elliptical mirror optionally combined with a collecting lens instead of the parabolic mirror.

First Aspect of the Invention

A first aspect of the cathodoluminescence system to which the present invention relates will now be described with reference to FIGS. 3-5.

Figure 3:
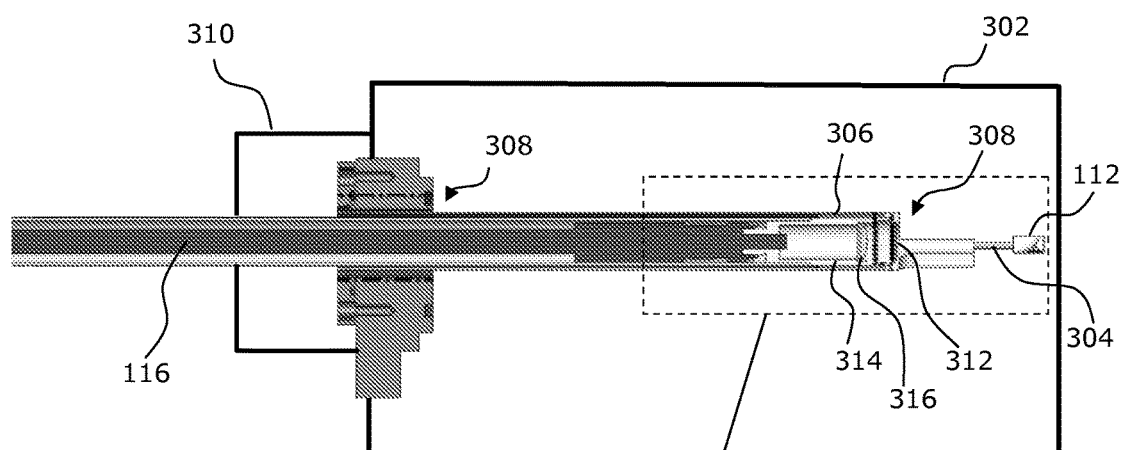
FIGS. 3 to 5 are diagrammatic representations of a first aspect of the cathodoluminescence detection system implemented by the microscope in FIG. 1.

FIG. 3 is a partial representation of the collection system relative to the vacuum chamber of a microscope.

Figure 4:
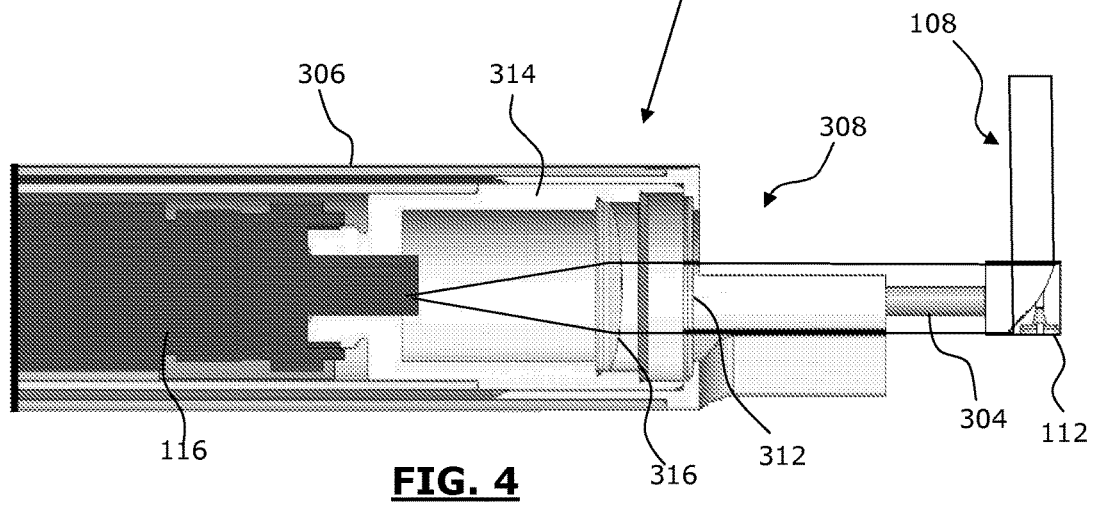
Figure 5:
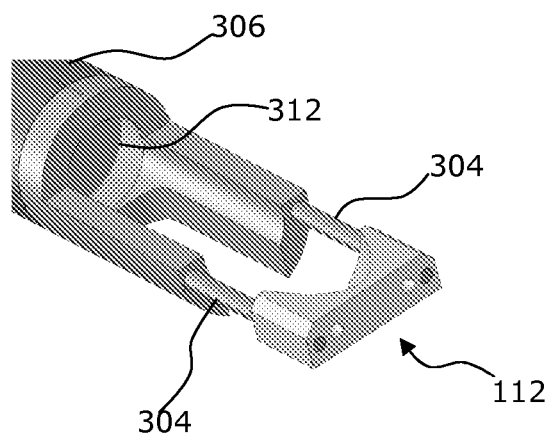

FIG. 4 is a more detailed cross-sectional representation of an area of FIG. 3 and FIG. 5 is an isometric view of the same region.

According to this first aspect, the collection optic 112 is capable of being arranged in a vacuum chamber 302 of the microscope and the adjustment means 114 as well as the optical fibre 116 and the analysis means 118 are arranged in an environment at atmospheric pressure. In other words, the adjustment means 114, the optical fibre and the analysis means are outside the vacuum chamber 302 of the microscope.

To this end, in the example shown in FIGS. 3 to 5, the collection optic 112, which is a parabolic mirror as shown in FIG. 2, is securely attached using two screws 304 to a first cylinder 306, called outer cylinder, at its proximal end 308. The collection optic 112 is connected to the outer cylinder so that the optical axis of the collection optic 112 merges with the axis of symmetry of the outer cylinder 306.

This outer cylinder 306 enters the vacuum chamber by means of an opening 308 formed in a wall of the vacuum chamber. This opening 308 is arranged opposite the light radiation sent by the collection optic 112.

The outer cylinder 306 and the wall of the vacuum chamber 302 are held together by a leaktight device 310 preserving the pressure level inside the vacuum chamber.

The outer cylinder 306 comprises at its proximal end 308, i.e. the end to which the collection optic 112 is securely attached, a transparent window seal 312 preserving the vacuum level inside the vacuum chamber 302 while letting through the light radiation collected and sent by the collection optic 112. Thus, downstream of the window seal, the inside of the outer cylinder 306 is separated from the vacuum chamber in a leaktight manner and is at atmospheric pressure.

A second cylinder 314, called inner cylinder, is arranged inside the outer cylinder 306 downstream of the window seal 312, i.e. in the part at atmospheric pressure. The axis of symmetry of the inner cylinder 314 merges with the axis of symmetry of the outer cylinder 306 and is therefore perfectly aligned with the optical axis of the collection optic 112. The inner cylinder 314 is removably arranged in the outer cylinder 306 and can rotate freely.

The adjustment means 114 are arranged in this inner cylinder 314. In the present example, shown in FIGS. 3 and 4, the adjustment means 114 comprise a convex collecting lens 316 arranged at the proximal end of the inner cylinder 314. This lens 316 allows for the width of the light radiation 108 to be adjusted at the input of the optical fibre 116.

The input of the optical fibre is also arranged inside the inner cylinder downstream of the collecting lens 316 and centred very accurately relative to the optical axis of the collecting lens 316.

The inner cylinder can also comprise any optical component necessary for the examination of the sample, for example a polariser.

The fact that the inner cylinder can rotate freely allows for the orientation of the various optical components to be modified without having to remove them.

Thus, according to this first aspect of the cathodoluminescence detection system, the optical components comprising the adjustment means and the input of the optical fibre can be accessed easily to change, repair or reposition them.

Second Aspect of the Invention

A second aspect of the cathodoluminescence system to which the present invention relates will now be described with reference to FIGS. 6 and 7.

Figure 6:
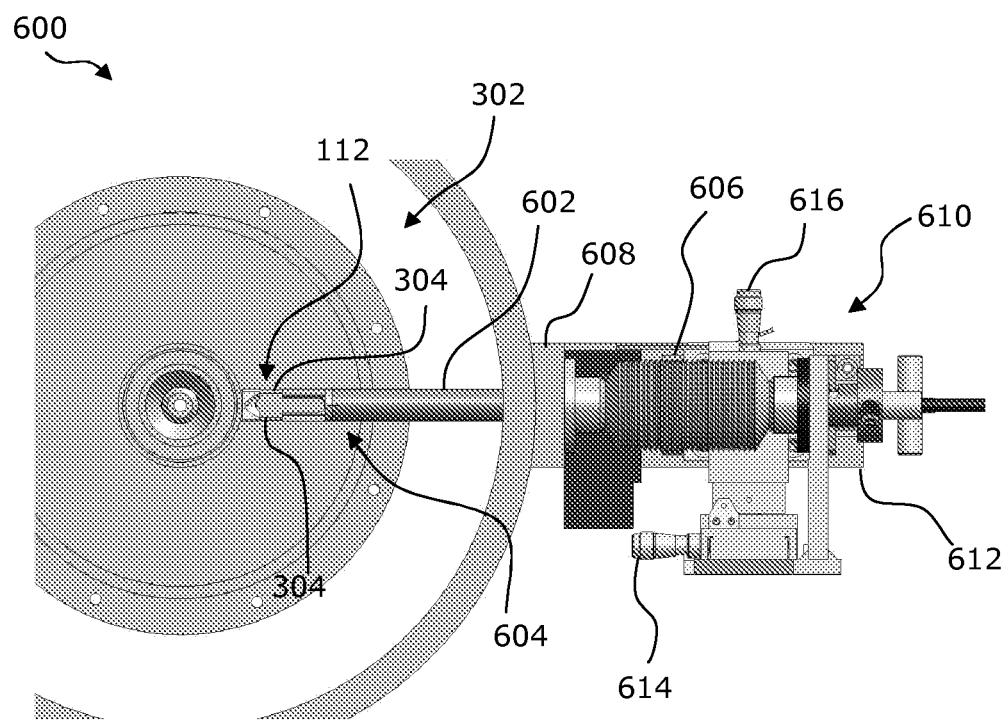
FIGS. 6 and 7 are diagrammatic representations of a second aspect of the cathodoluminescence detection system implemented by the microscope in FIG. 1.

FIG. 6 is a partial top view of a microscope 600 implementing a cathodoluminescence detection system according to the second aspect of the invention. In FIG. 6, the collection optic is completely retracted, allowing for standard use of the microscope. It is not a view of the cathodoluminescence detection system in operation. FIG. 7 is a side view of the microscope in FIG. 6.

The collection optic 112 is securely connected to a cylinder 602 by means of two screws 304 at the proximal end 604 of the cylinder 602. The collection optic 112 is located in the vacuum chamber 302 of the microscope 600. The cylinder 602 can also comprise optical adjustment means 114 and the input of the optical fibre 116, which can for example be arranged in a second cylinder removably inserted into the cylinder 602, rotating freely and mounted so that the axis of symmetry merges with the axis of symmetry of the cylinder 602. The cylinder 602 can be the outer cylinder 306 and comprise the inner cylinder 314, as described above.

The cylinder 602 enters the vacuum chamber 302 by means of an opening 604 formed in a wall of the vacuum chamber. This opening 604 is arranged opposite the light radiation sent by the collection optic 112. The diameter of this opening is greater than the outer diameter of the cylinder 602 in order to allow the movement of the outer cylinder in the three dimensions of space. This opening 604 can be the opening 308 described above.

A bellows seal 606 is attached to the cylinder 602 and surrounds the cylinder 602 in a leaktight manner. This bellows seal is moreover attached in a leaktight manner to the wall of the vacuum chamber 302, around the opening 602, by means of a connecting part 608 that hugs the outer shape of the wall of the vacuum chamber around the opening 602. Thus, the connection between the bellows seal 606 and the cylinder 602 is leaktight, as is the connection between the bellows seal 606 and the wall of the vacuum chamber 302. The bellows seal 606 permits the movement of the cylinder 606 in the three directions of space while at all times preserving the leaktightness of each of its connections with the cylinder 602 on the one hand and the wall of the vacuum chamber 302 on the other hand.

Figure 7:
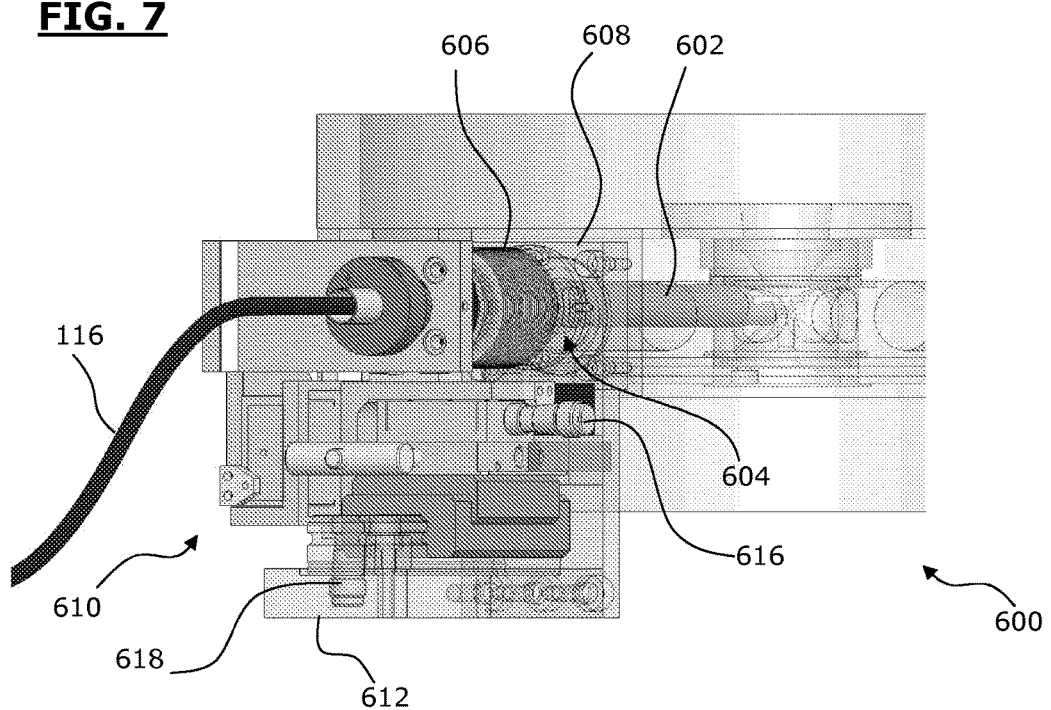

The cylinder 602 comprises a window seal (not shown in FIGS. 6-7). This window seal allows for the leaktightness of the vacuum chamber 302 to be preserved. This window seal can be arranged upstream or downstream of the optical adjustment means 114 and the input of the optical fibre 116. This window seal can for example be the window seal 312 in FIGS. 3-5, when the two aspects of the cathodoluminescence system described in the present application are combined.

The cylinder 602 is securely mounted on a three-dimensional movement device 610 on the side of its distal end 612, i.e. the end on the opposite side to the collection optic 112. This three-dimensional movement device 610 is placed on a stage 612 movably mounted on the wall of the vacuum chamber 302. The device 610 comprises three micrometric screws 614, 616 and 618 used to move the cylinder 602 in the three dimensions of space.

As the collection optic 112 is integral with the cylinder 602, the movement of the cylinder 602 results in the movement of the collection optic 112. Thus, by means of this second aspect of the cathodoluminescence detection system, it is possible for the operator to move the collection optic from the outside of the microscope to position it better in relation to the electron emission source and relative to the sample, to improve the conservation of the intensity of the light radiation collected downstream of the collection optic, together with the spectral resolution of the optical signal.

On reading the present application, it is clear to a person skilled in the art that the first and second aspects of the cathodoluminescence detection system can be combined. As set out above, the cylinder 602 shown in FIGS. 6 and 7 can be replaced by the outer cylinder 306 in FIGS. 3 to 5 comprising the window seal 312, the inner cylinder 314 in which the adjustment means 114 (in particular the collecting lens 316) are arranged, and the input of the optical fibre 116. By combining the first and second aspects of the invention it is possible to obtain a cathodoluminescence detection system that is both flexible and adjustable and can be used to optimise the light intensity collected and its conveyance to the analysis means while conserving optimum spectral resolution by common, easy-to-implement means.

Third Aspect of the Invention

Figure 8:
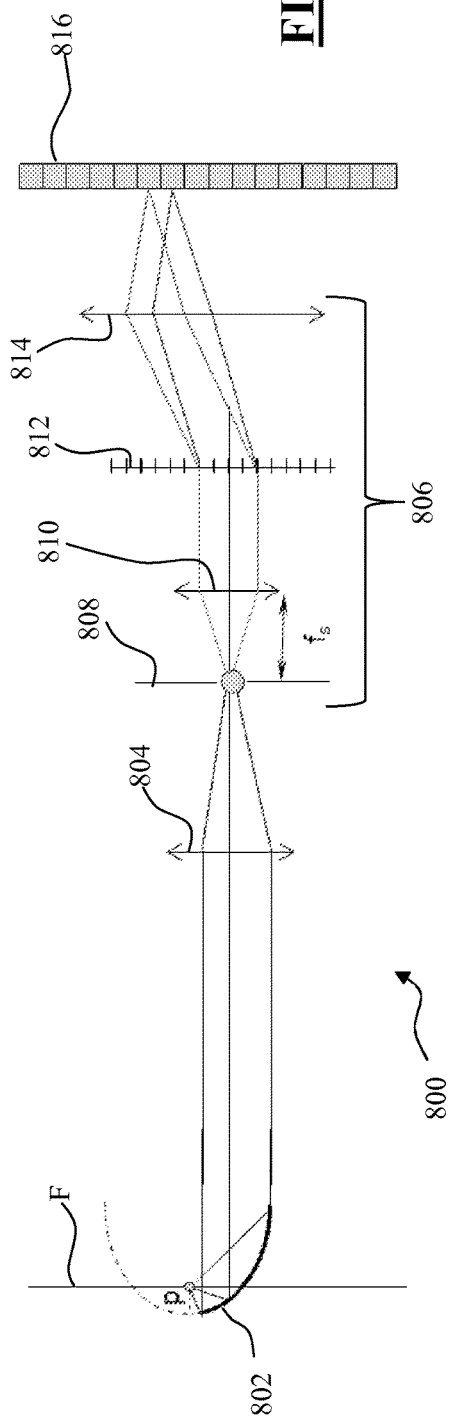
FIG. 8 is a diagrammatic representation of a first example of the optical path of a cathodoluminescence system according to a third aspect of the invention.

FIG. 8 is a diagrammatic representation of a first example of the optical path of a cathodoluminescence system according to the third aspect of the invention.

The optical path 800 in FIG. 8 comprises as a means of collection a parabolic mirror 802 that can be identical to the parabolic mirror 200 in FIG. 2, which collects light radiation coming from a sample illuminated by a particle beam.

The optical path 800 comprises as processing means a lens 804, which can be the lens 316 in FIGS. 3 and 4, receiving the light radiation collected by the parabolic mirror 802 and injecting it into a spectrometer 806 the input of which is represented by the plane 808. The spectrometer 806 comprises a lens 810 arranged upstream of the grating 812 of the spectrometer 806 which sends the light radiation entering the spectrometer 806 to the grating 812 of the spectrometer 806. The spectrometer 806 also comprises a lens 814 arranged downstream of the grating 812 of the spectrometer 806 that represents the output of the spectrometer and sends the light radiation leaving the spectrometer 806 to a CCD camera 816. The spectrometer 806 and the camera 816 constitute the analysis means of the cathodoluminescence system.

According to the third aspect of the invention, the parabolic mirror, the lens 804 and the spectrometer 806 are selected and positioned so that:
  the parabolic mirror 802 has a value of p of 2 mm and a thickness of 3 mm;
  the maximum output angle of the parabolic mirror 802 is zero (parallel beam) and the maximum input angle of the lens 804 is zero (parallel beam);
  the profile of the radiation coming from the parabolic mirror 802 in the input plane of the lens 804 is 9 mm by 3 mm and the useful input diameter of the lens 802 is 8 mm;
  taking the centre of the parabolic mirror to be the midpoint between its horizontal and vertical surfaces (parallel to the optical axis of the lens), the offset of the lens 804 relative to the centre of the parabolic mirror is less than 100 microns. The position of the focus of the mirror is under these circumstances calculated to obtain the maximum collection angle for the mirror; and
  the maximum output angle of the lens 804 is 6.3°.

Moreover:
  the width of the beam at the input of said spectrometer in the dispersive direction is typically 100 or 70 microns and the limit diameter at the input of the spectrometer below which the resolution of the spectrometer no longer depends on the diameter of the waist of the light radiation at the input of the spectrometer is 70 µm.

Moreover:
  the accuracy of the movement in at least one of the two directions of space perpendicular to the optical axis and in the direction of the optical axis is greater than or equal to 1 µm, ensuring resolution at the input of the spectrometer better than 30 microns, i.e. less than the limit size at the input of the spectrometer below which resolution deteriorates.

Figure 9:
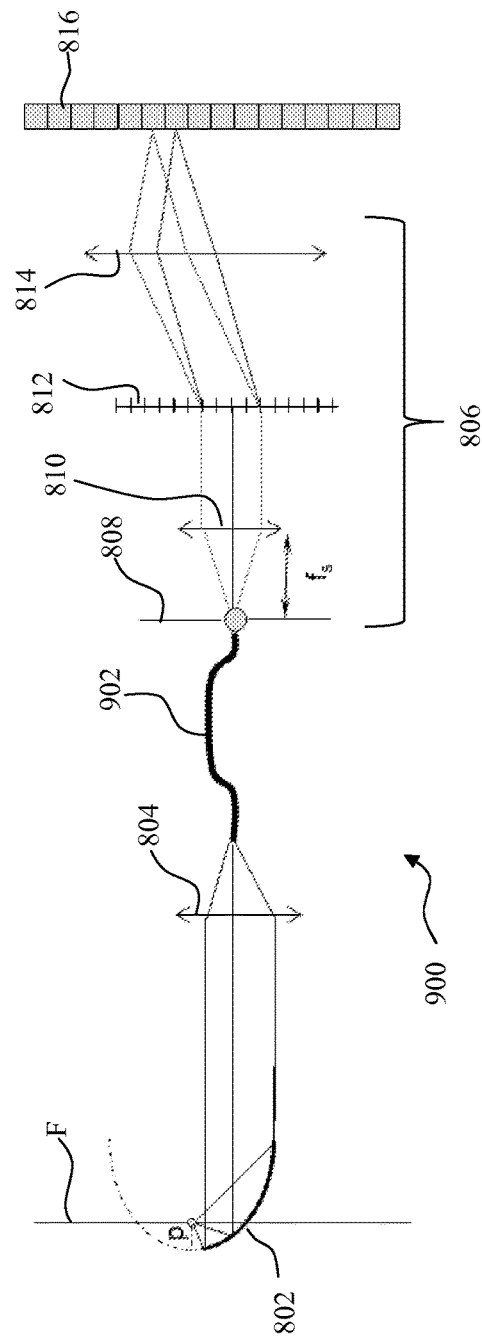
FIG. 9 is a diagrammatic representation of a second example of the optical path of a cathodoluminescence system according to a third aspect of the invention comprising an optical fibre.

FIG. 9 is a diagrammatic representation of a second example of the optical path of a cathodoluminescence system according to the third aspect of the invention.

The optical path 900 in FIG. 9 comprises all of the components of the optical path 800 shown in FIG. 8.

The optical path 900 also comprises an optical fibre 902, which can be the optical fibre 116 in FIGS. 3 and 4. The input of the optical fibre 902 is positioned at the focal point of the lens 804 and the output of the optical fibre is positioned in the input plane of the spectrometer 806 represented by the plane 808.

The parameters of the optical components of the optical path 900 are identical to the parameters given with reference to FIG. 1.

However:
the width of the radiation at the input of the optical fibre 902 is, if the object being examined is infinitely small, of the order of 15 microns, and the useful input diameter of the optical fibre is 70 µm;
the maximum angle of the radiation coming from the lens 804 is 6.3° and the limit angle of incidence at the input of the optical fibre 902 is 6.9°; and
the offset of the fibre 902 relative to the centre of the lens is less than 100 microns.

Moreover:
the width of the beam at the input of said spectrometer in the dispersive direction is 70 µm and the limit diameter at the input of the spectrometer below which the resolution of the spectrometer no longer depends on the diameter of the waist of the light radiation at the input of the spectrometer is 70 µm.

Moreover:
the accuracy of the movement in at least one of the two directions of space perpendicular to the optical axis and in the direction of the optical axis is greater than 1 µm, ensuring resolution at the input of the optical fibre better than 30 microns, i.e. less than the limit size at the input of the spectrometer below which resolution deteriorates; and
the diameter of each optical fibre divided by the magnification produced on the optical path up to the optical fibre bundle 1002 is 2 µm.

FIGS. 10 and 11 are diagrammatic representations of different views of a third example of the optical path of a cathodoluminescence system according to the third aspect of the invention comprising an optical fibre bundle.

The optical path 1000 in FIGS. 10 and 11 comprises all of the components of the optical path 800 shown in FIG. 8.

The optical path 1000 also comprises an optical fibre bundle 1002, made up for example of several optical fibres such as the optical fibre 902 in FIG. 9. The input of the optical fibre bundle 1002 is positioned at the focal point of the lens 804 and the output of the optical fibre bundle is positioned on the input plane of the spectrometer 806 represented by the plane 808.

The parameters of the optical components of the optical path 1000 are identical to the parameters given with reference to FIG. 1.

However:
the width of the radiation at the input of the optical fibre bundle 1002 is greater than or equal to 200 microns and the useful input diameter of each optical fibre constituting the optical fibre bundle 1002 is 70 µm;
the maximum input angle of the radiation coming from the lens 804 is 6.3° and the limit angle of incidence at the input of each optical fibre constituting the optical fibre bundle 1002 is 6.9°; and
the offset of the optical fibre bundle 1002 relative to the centre of the lens is of the order of one hundred microns.

Moreover:
the width of the beam at the input of said spectrometer in the dispersive direction is 70 µm and the limit diameter at the input of the spectrometer below which the resolution of the spectrometer no longer depends on the diameter of the waist of the light radiation at the input of the spectrometer is 70 µm.

Moreover:
the accuracy of the movement in at least one of the two directions of space perpendicular to the optical axis and in the direction of the optical axis is 1 µm or better than 1 µm, ensuring resolution at the input of the optical fibre better than 30 microns, i.e. less than the limit waist at the input of the spectrometer below which resolution deteriorates; and
the diameter of each optical fibre divided by the magnification produced on the optical path up to the optical fibre bundle 1002 is 2 µm.

According to the invention, each of these three embodiments allows for the light radiation emitted by the sample to be conveyed to the CCD camera while preserving more light intensity, optimum spectral resolution and the possibility of using the invention in a microscope using charged particles capable of forming nanometric or even angstromic probe beams.

Moreover, the third example shown in FIGS. 10 and 11 also allows for the correction of dynamic or systematic errors or errors due to scanning of the sample.

To this end, at the input 1202 of the bundle 1002, the optical fibres constituting the bundle 1002 are arranged in a circular or hexagonal manner around each other. At the output 1204 of the bundle 1002, the optical fibres constituting the bundle 1002 are aligned on top of each other in a direction perpendicular to the dispersive direction of the spectrometer. The input 1202 and the output 1204 of the optical fibre bundle 1002 are shown diagrammatically in FIGS. 12 and 13.

FIGS. 12 and 13 are diagrammatic representations of two configurations in which the light radiation reaches the input of the optical fibre bundle in two different positions in the system in FIGS. 10 and 11. In the configuration shown in FIG. 12, the light radiation reaches the input 1202 of the optical fibre bundle 1002 at a point 1206 offset to the left relative to its centre and in the configuration shown in FIG. 13, the light radiation reaches the input 1202 of the optical fibre bundle 1002 at a point 1302 offset to the right relative to its centre. Depending on the fibres concerned, the light radiation entering the optical fibre bundle 1002 does not leave the optical fibre bundle 1002 in the same positions. However, in both cases and despite the difference in position of the light radiation reaching the input plane of the optical fibre bundle 1002, all of the radiation is collected and conveyed to the spectrometer by the optical fibre bundle 1002 and the spectra 1208 and 1304 obtained at the CCD camera for each of the two sets of radiation are identical. This takes place without any loss of spectral resolution or intensity.

The three aspects of the present invention can be combined, in twos or all three, in a single cathodoluminescence system.

Of course, the invention is not limited to the examples which have just been described and numerous adjustments can be made to these examples without exceeding the scope of the invention.

The invention claimed is:

1. A cathodoluminescence detection system comprising:
a collection optic collecting light radiation coming from a sample illuminated by a charged particle beam and sending said radiation to an analysis device, said collection optic being arranged in a vacuum chamber in which a pressure in the vacuum chamber is below atmospheric pressure,
an adjustment device configured to adjust the light radiation arranged downstream of the collection optic and said light radiation at the input of the analysis device, at least part of the adjustment device being arranged in an environment in which a pressure is greater than the pressure in said vacuum chamber, and
a first tube in the form of an outer cylinder aligned relative to the axis of the collection optic and integral with said collection optic, said outer cylinder comprising a window seal ensuring that the pressure is maintained in the vacuum chamber in which said collection optic is arranged; and
a second tube in the form of an inner cylinder enclosed by and centered in the outer cylinder and configured to receive the adjustment device with a view to injecting said light radiation into an optical fiber or into a detector,
said inner cylinder being arranged downstream from said window seal in a direction of a path of the light radiation so that said inner cylinder is at a pressure greater than the pressure in said vacuum chamber.

2. The system according to claim 1, further comprising a seal arranged between said collection optic and the adjustment device and capable of ensuring that said vacuum chamber is leak tight while permitting the light radiation to pass through.

3. The system according to claim 1, wherein the adjustment device comprises at least one lens arranged upstream of an optical fiber and capable of sending the light radiation into said optical fiber.

4. The system according to claim 1, wherein the collection optic comprises a parabolic mirror.

5. The system according to claim 1, wherein the collection optic comprises a plane mirror or an elliptical mirror associated with at least one optical lens.

6. The system according to claim 1, wherein the inner cylinder is removably mounted in the outer cylinder and rotates freely relative to said outer cylinder.

7. The system according to claim 1, wherein the adjustment device is configured to adjust the angle and size of the light radiation collected to the size and numerical aperture of a detector or an optical fiber.

8. The system according to claim 1, wherein the adjustment device comprises a diaphragm arranged to let the light radiation coming from the collection optic through to the analysis device and block at least one undesirable optical signal.

9. The system according to claim 1, further comprising a source of emission of a light beam propagating in the opposite direction to the direction of propagation of the light radiation, said light beam being directed towards the sample by the collection optic.

10. The system according to claim 1, further comprising a light analyzer configured to analyze the light radiation arranged downstream of the adjustment device.

11. The system according to claim 10, wherein the analysis device comprise a spectrometer, a CCD camera or a photomultiplier.

12. The system according to claim 1, wherein the collection optic is mounted movably in at least one dimension, said system also comprising positioning device capable of moving said collection optic in at least one dimension.

13. The system according to claim 12, wherein the positioning device comprise a stage mounted movably in at least one dimension, the collection optic being securely mounted on said stage, said system also comprising at least one positioning component capable of moving said stage in at least one dimension.

14. A microscope comprising:
a source (102) of emission of a charged particle beam, and a cathodoluminescence detection system according to claim 1.

15. The microscope according to claim 14, further comprising one of:
a bright field detector,
a dark field detector,
a EELS detector,
a camera for imaging or diffraction, or
a EDX detector.

* * * * *